Figure 1:
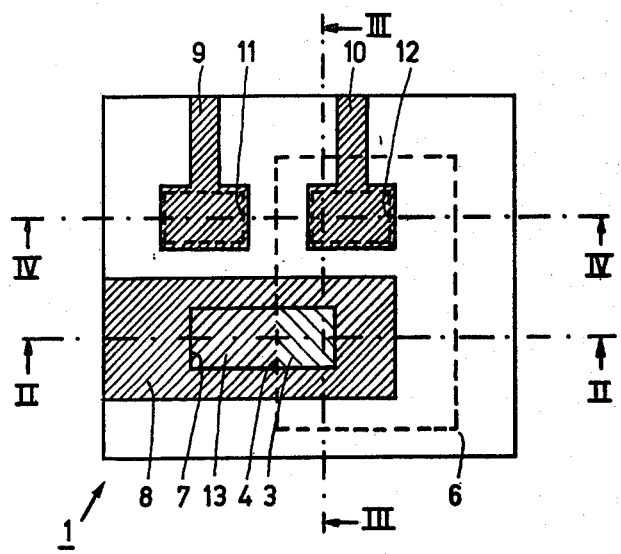

United States Patent [19]

van Gorkom et al.

[11] 4,325,084
[45] Apr. 13, 1982

[54] SEMICONDUCTOR DEVICE AND METHOD OF MANUFACTURING SAME, AS WELL AS A PICK-UP DEVICE AND A DISPLAY DEVICE HAVING SUCH A SEMICONDUCTOR DEVICE

[75] Inventors: Gerardus G. P. van Gorkom; Arthur M. E. Hoeberechts, both of Eindhoven, Netherlands

[73] Assignee: U.S. Philips Corporation, New York, N.Y.

[21] Appl. No.: 170,363

[22] Filed: Jul. 21, 1980

Related U.S. Application Data

[62] Division of Ser. No. 971,767, Dec. 21, 1978, Pat. No. 4,259,678.

[30] Foreign Application Priority Data

Jan. 27, 1978 [NL] Netherlands .................... 7800987

[51] Int. Cl.³ .................... H04N 3/14; H04N 3/16; H01L 29/90; H01J 19/02
[52] U.S. Cl. .................... 358/241; 358/242; 357/13; 313/391; 313/446; 313/346 R; 313/503; 250/492.3
[58] Field of Search .................... 358/241, 242, 217; 313/441, 446, 346 R, 325, 391, 495, 503; 340/781; 250/492 B, 457, 311; 328/123, 124; 357/13, 23, 52, 55; 29/569 R; 315/169.3, 169.1, 13 R

[56] References Cited

U.S. PATENT DOCUMENTS 4,259,678 3/1981 van Gorkom et al. .................... 357/13

Primary Examiner—John C. Martin
Attorney, Agent, or Firm—Paul R. Miller

[57] ABSTRACT

The invention relates to a semiconductor cathode based on avalanche breakdown in the p-n junction. The released electrons obtain extra accelerating energy by means of an electrode provided on the device. The achieved efficiency increase makes the manufacture of such cathodes in planar silicon technology sensible. Such cathodes are applied, for example, in cathode ray tube, flat displays, pick-up tubes and electron lithography.

10 Claims, 32 Drawing Figures

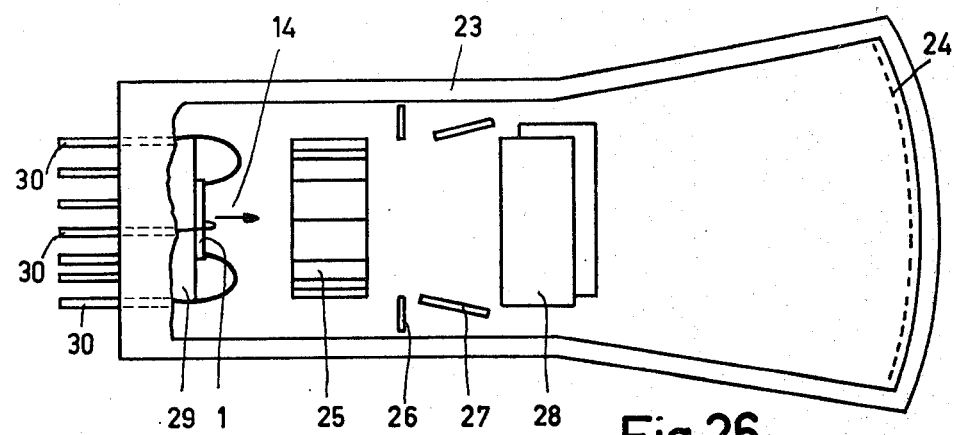
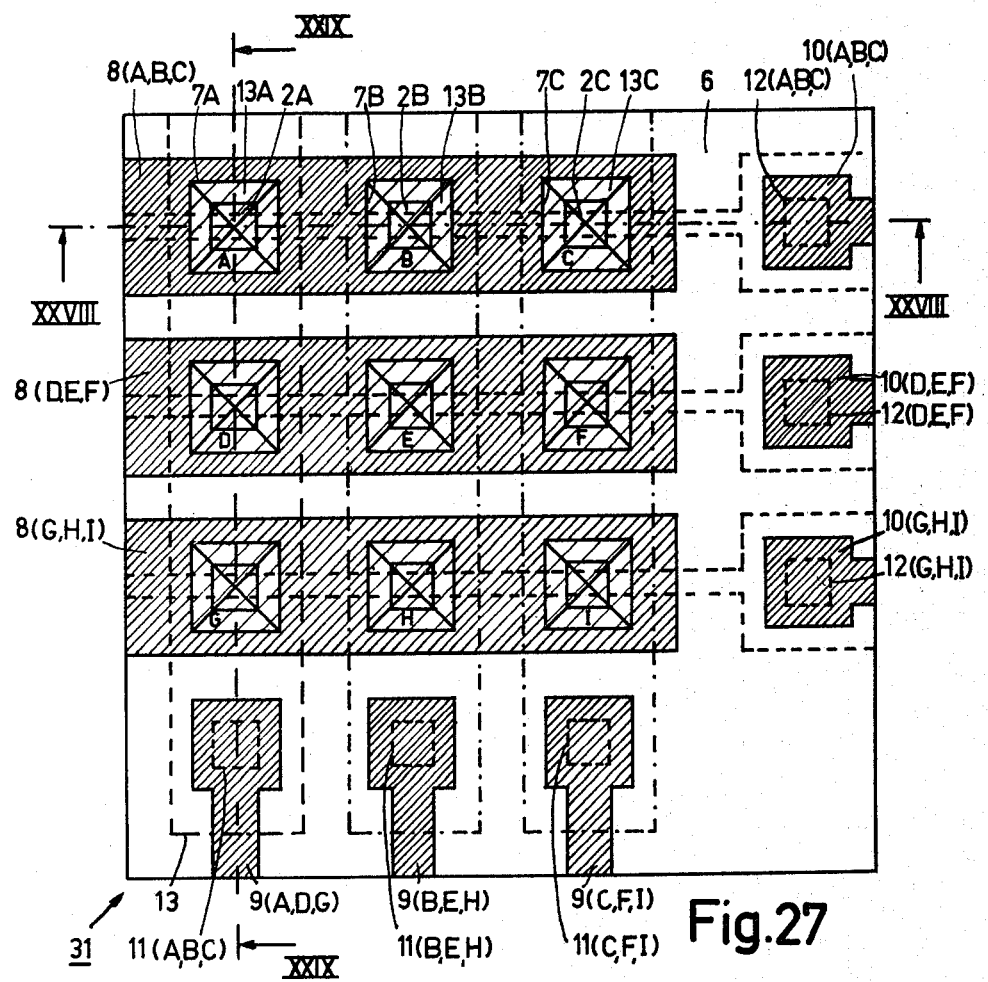

SEMICONDUCTOR DEVICE AND METHOD OF MANUFACTURING SAME, AS WELL AS A PICK-UP DEVICE AND A DISPLAY DEVICE HAVING SUCH A SEMICONDUCTOR DEVICE

This application is a divisional application of Ser. No. 971,767, filed Dec. 21, 1978, now U.S. Pat. No. 4,259,678.

The present invention relates to a semiconductor device for generating an electron flow, comprising a cathode having a semiconductor body with a p-n junction having the depletion zone adjoining a surface of the semiconductor body, in which, by applying a voltage in the reverse direction across the p-n junction, electrons are generated in the semiconductor body by avalanche multiplication and emerge from the semiconductor body.

The present invention also relates to a method of manufacturing such a semiconductor device, as well as to a pick-up device and a display device having such a semiconductor device.

Semiconductor devices of the above-mentioned kind are disclosed in British patent specification No. 1,303,659. They are used inter alia in cathode ray tubes in which they replace the conventional thermal cathode. In a thermal cathode, electron emission is generated by heating. In addition to the high energy consumption in behalf of the heating, the cathodes exhibit the disadvantage of not being immediately ready for operation because they must first be heated before emission occurs. Moreover, the cathode material is lost in the long run by evaporation so that such cathodes have a restricted life.

In order to avoid the heating source which is cumbersome in practice and also to mitigate the other disadvantages, searches have been made for a cold cathode.

One of the solutions was considered to be the so-called field emission cathode in which electrons are drawn from a punctiform non-heated cathode by means of a strong external electric field. However the application of such field emission cathode is very restricted due to the required very strong external electric field and the vulnerability of the cathode to electric discharges in the emission space and the ultra high vacuum required for stable emission (10 to 100 nano Pascal).

Another solution consists in a semiconductor device in which a semiconductor body of the n-type is covered with a very thin p-type surface region, where the p-n junction thus obtained is biased in the forward direction. As a result of this, electrons are injected into the p-type surface region, which region has a thickness smaller than the diffusion recombination length of electrons in the p-type region. Provided the electrons have sufficient energy, they can emerge from the semiconductor body at the surface of the p-type region. In order to stimulate such emerging of the electrons, the surface is usually coated with a material reducing the electron work function, for example, a cesium-containing material.

One of the problems in these devices is the occurrence of recombination in the thin p-layer which restricts the injection current.

Moreover, during use the above-mentioned coating layer of material reducing the electron work function is slowly lost, which imposes a restriction on the life of the so-called "negative electron affinity" cathodes.

Besides there exist cathodes based on the emerging of electrons from the semiconductor body when a p-n junction is operated in the reverse direction in such manner that avalanche multiplication occurs. Such a cathode forms the subject matter of the present patent application.

In a semiconductor device as described in the already mentioned British patent specification No. 1,303,659, avalanche multiplication occurs at a sufficiently high voltage in the p-n junction. Some electrons may obtain as much kinetic energy as is necessary to exceed the electron work function; and these electrons are then released at the surface to form the flow of electrons. In the example of the above-mentioned patent specification such a cathode is described in which silicon carbide is used as a semiconductor material. In fact, only with silicon carbide is an efficiency reached in such a device, which is a ratio between the generated flow of electrons and the required avalanche current through the p-n junction, that this is useful for practical application.

It is the object of the present invention to provide a semiconductor device in which the efficiency has been improved so much as compared with that in the device described in the British patent specification that silicon may also be used as a material for such a cathode. It is based on the recognition of the fact that this can be achieved by influencing the electric field in the immediate proximity of the p-n junction.

For that purpose a semiconductor device according to the present invention is characterized in that the surface has an electrically insulating layer in which at least one aperture is provided where at least in the operating condition at least a part of the depletion layer associated with the p-n junction adjoins the surface, and in which at least one accelerating electrode is provided on the electrically insulating layer on the edge of the aperture in the immediate proximity of the surface-adjoining part of the depletion layer.

It has been found that the efficiency in such a semiconductor device has been improved so much that, even when materials other than silicon carbide are used, for example silicon, efficiencies can be reached which are useful for practical purposes. This has for its advantage that on the one hand the cathode structure can be made by means of the technology known for the manufacture of integrated circuits in silicon and that on the other hand cathode structures can be incorporated in integrated structures without technological disadvantages. A further advantage resides in the fact that the emission can be modulated by means of voltages on the accelerating electrode without requiring much power in contrast with the modulation of the emission by means of reverse current. In addition, the direction of the emission can be influenced if the accelerating electrode consists of two or more parts which are each brought at different potentials.

The established efficiency improvement can be explained as follows. First of all, as a result of the strong electric field at the surface generated by the accelerating electrode, a decrease of the work function occurs by the Schottky effect. Also, the formation of space charge is prevented.

Finally, the electron paths are better defined than in available devices. The device described in British patent specification No. 1,303,659 shows a p-n junction which intersects the surface. When such a semiconductor device is incorporated in a cathode-ray tube or another discharge device, the cathode will generally form part of a larger assembly in which, as a result of other electrodes, for example an anode or control grids, electrons in the operating condition of the semiconductor device will be drawn away the direction perpendicular to the major surface of the semiconductor body. Considered in a wider sense, the electrons are therefore subjected to an electric field having a component perpendicular to said major surface.

In this connection a major surface is referenced because such a cathode device may also be designed with a major surface having recesses in which the p-n junction terminates at the wall or at the bottom of the recesses. Such wall and bottom, respectively, then fulfil the function of the surface mentioned in the preamble.

However, when the p-n junction terminates at the major surface, the electric field of the junction emitting electrons as a result of avalanche breakdown is directed parallel to the major surface, namely perpendicular to the p-n junction. The result of this is that the emanating electrons have a velocity component along the major surface, or perpendicular to the desired direction, which may be disadvantageous in particular when a narrow electron beam is required. By giving the accelerating electrode a sufficiently high potential, the electrons are accelerated in the direction of the electrode (also those electrons which when emanating have a marginal kinetic energy) and the velocity component perpendicular to the desired direction is considerably reduced with respect to that in the above-mentioned device.

As already noted, the p-n junction need not always terminate at the major surface but may also terminate, for example, in the wall of a recess with the electric field already having the desired direction as a result of the p-n junction. In such a configuration also, the provision of an accelerating electrode has a strong efficiency-increasing effect. In fact, as already stated, it is prevented by this that a space charge is formed near the p-n junction, which imposes an upper limit on the current through the junction. In addition it holds that in this case also the work function is reduced by the Schottky-effect. It has been found that the p-n junction need not ever terminate at a surface or a wall of a recess or, in the case of a flat p-n junction, at the surface, but that it is sufficient when the depletion zone associated with the p-n junction adjoins the surface of a wall. Generally the p-n junction will form a boundary between a highly doped and a low-doped semiconductor regions.

A preferred embodiment according to the present invention is characterized in that the p-n junction is formed between a lower-doped first region of a first conductivity type and a more highly doped second region of a second conductivity type and that at the area of the aperture a surface layer is present having a higher doping concentration of the first conductivity type than that of the underlying first region.

The result of this measure is that the depletion zone is narrowed at the surface. As a result of this, the field strength in the depletion zone is largest near the surface, so that the avalanche multiplication and hence the emission occur mainly in the region where the p-n junction comes to the surface.

Another preferred embodiment in accordance with the present invention is characterized in that the accelerating electrode comprises a conductive layer which is provided on the electrically insulating layer and has a window at least at the area of the aperture in the insulating layer. When a voltage is applied to the conductive layer, an equipotential plane is formed above the p-n junction substantially parallel to the surface. This will contribute to the fact that at the area of the window the field lines obtain a component perpendicular to the surface of the semiconductor body.

The aperture preferably has the form of a narrow gap having a width which is of the same order of magnitude as the thickness of the insulating layer. It will be clear that the gap should not be too wide to ensure a good equipotential plane. Such a gap need not be straight but may have a curved shape, for example in display applications. Generally this means that during the manufacture of such devices the aligning tolerances are very critical since gap widths are concerned which are in the order of a few microns, which in addition alignment has to be carried out critically in two directions.

In other embodiments the orientation of the gap edge with respect to the p-n junction, however, will not be critical at all. In such a device the p-n junction crosses the gap preferably approximately at right angles. As a result of this the problems regarding alignment are avoided.

The present invention furthermore relates to a method of manufacturing a semiconductor device as mentioned above in which the starting material is a semiconductor body comprising a p-n junction of which the associated depletion zone at least locally adjoins the surface of the semiconductor body. In a method according to the present invention the surface is provided with an electrically insulating layer and an electrically conductive layer is provided on the electrically insulating layer having an aperture provided at least at the area of the surface-adjoining depletion zone, both in the electrically conductive layer and in the electrically insulating layer. Self-aligning methods may advantageously be used in such a method. The same applies if the opening of the insulating layer is succeeded by an etching step to obtain a recess.

In a preferred embodiment of the method the doping concentration in a surface layer is increased by means of ion implantation at least at the area of the aperture on the low-doped side of the p-n junction.

This implantation may be carried out prior to providing an electrically insulating layer but, alternatively, both the electrically insulating layer and the assembly of insulated layer and conductive layer may serve as a mask during the implantation. This means that not only on the low-doped side of the p-n junction the concentration of impurities at the surface is increased, but also that on the highly doped side the net concentration of atoms which supply the charge carriers decreases. Generally, however, the difference in concentration between the two regions is such that this effect is hardly noticeable on the highly doped side. As already noted, it is stimulated by this measure that the avalanche multiplication occurs more rapidly at the surface than in the deeper-situated part of the device.

Several applications exist for a display device having a semiconductor electrode according to the present invention. One of such applications is, for example, a display tube which comprises a fluorescent screen to be activated by the electron flow originating from the semiconductor device.

In the field of electron lithography an assembly of such cathodes may be activated so that a desired pattern is generated. This pattern may then serve as an electron emitter and be displayed for example on a photoresist layer through one or more electron lenses. Such a system may be used in the manufacture of integrated circuits or miniature wiring.

Figures 2, 3:
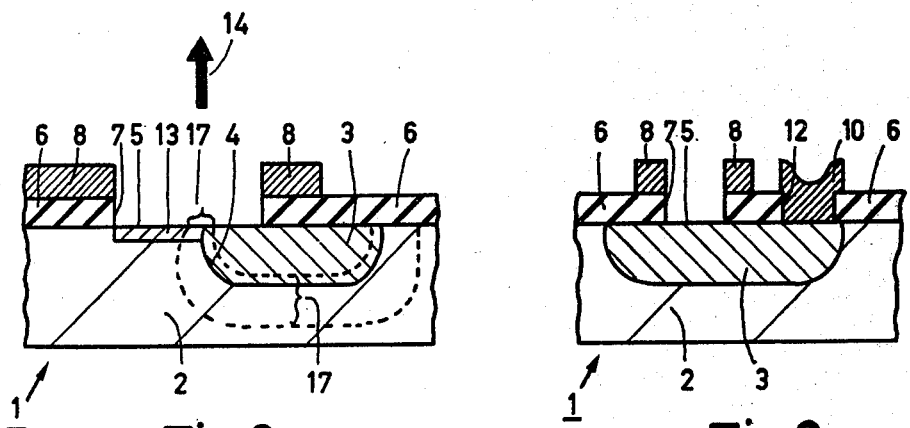
Figure 4:
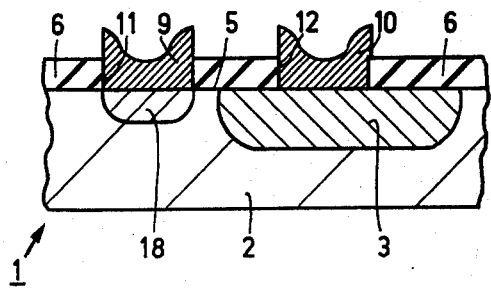
Figure 5:
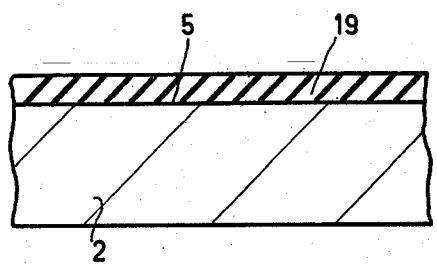
Figure 6:
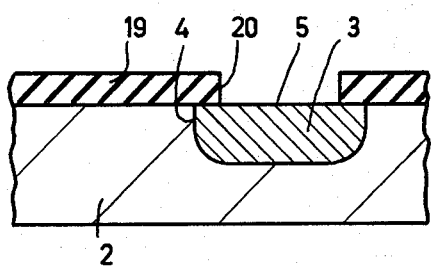
Figure 7:
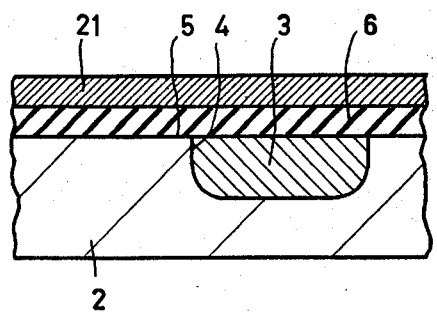
Figure 8:
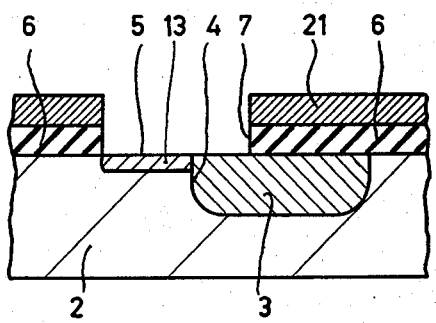
Figure 9:
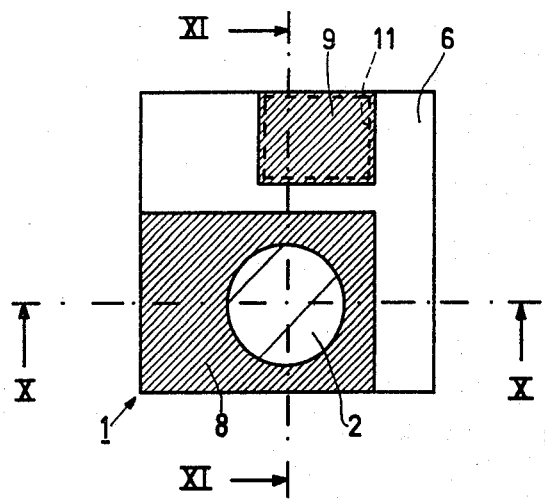
Figure 10:
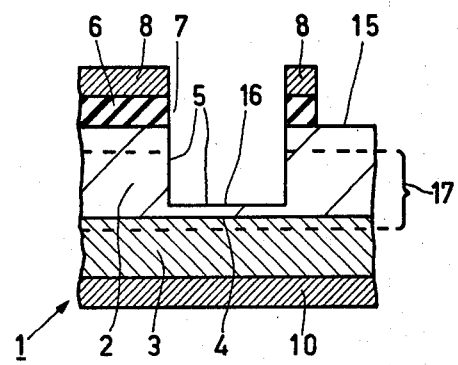
Figure 11:
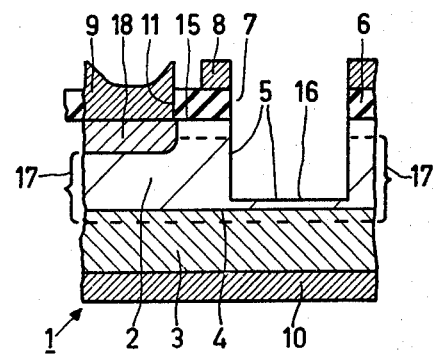
Figure 15:
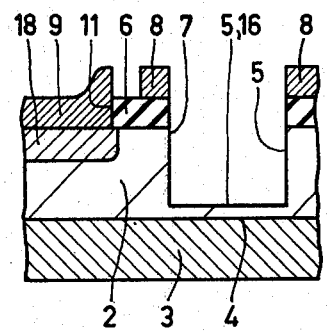
Figure 16:
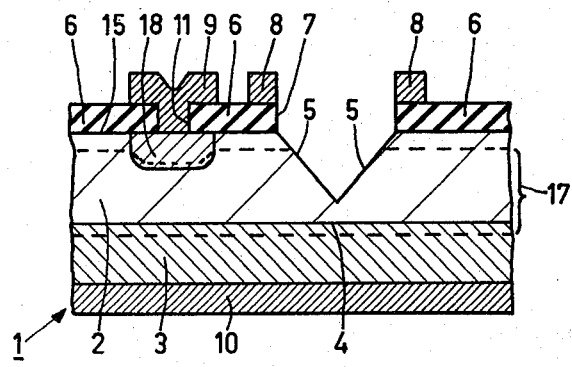
Figure 17:
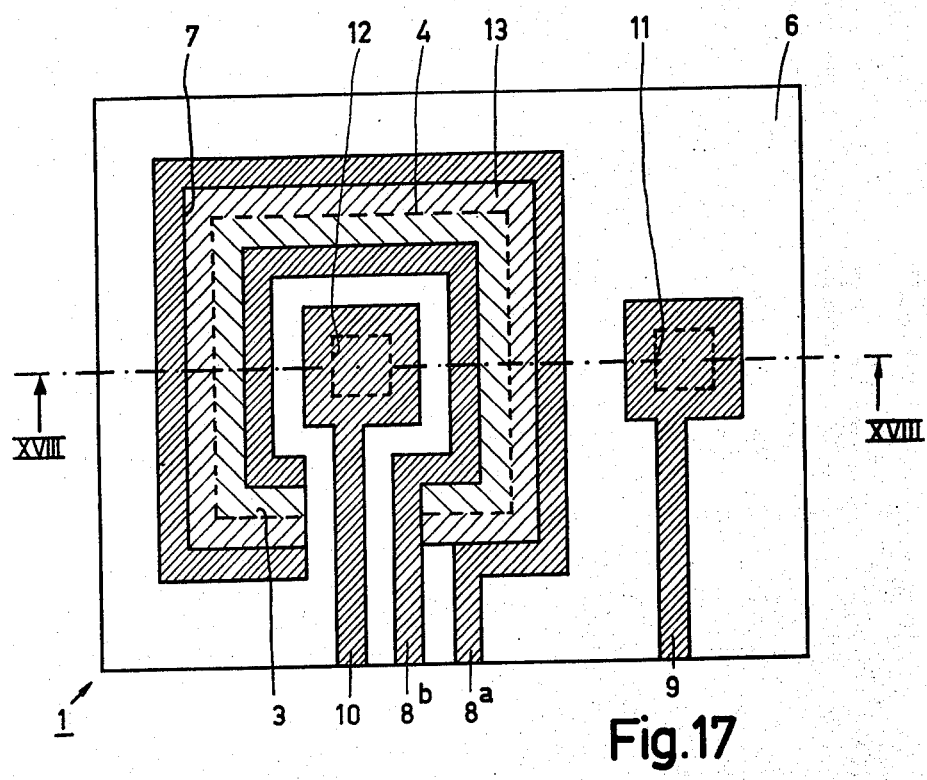
Figure 18:
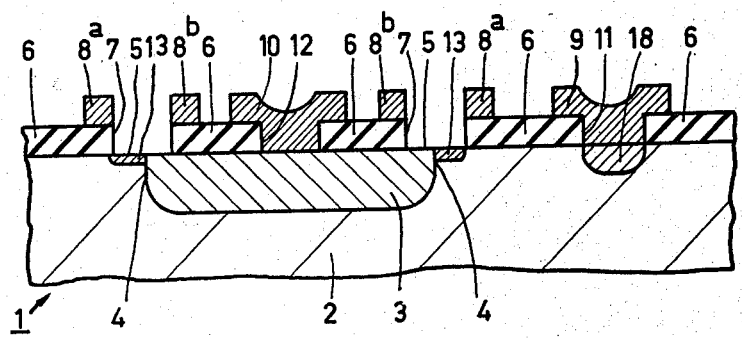
Figure 19:
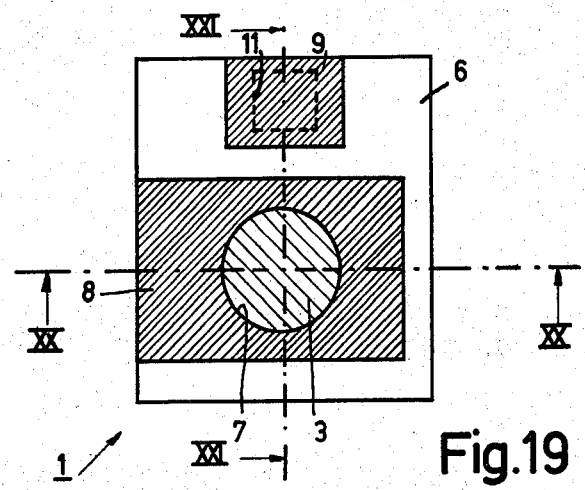
Figure 20:
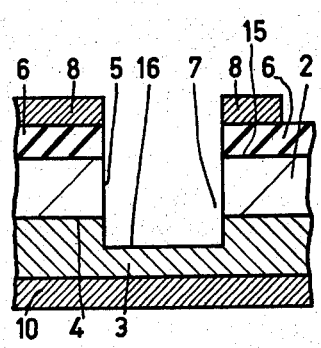
Figure 21:
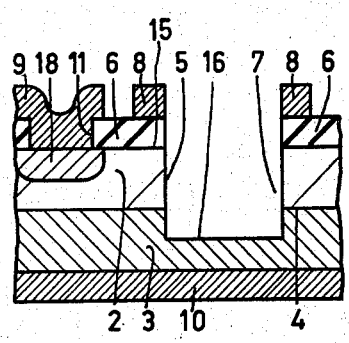
Figure 22:
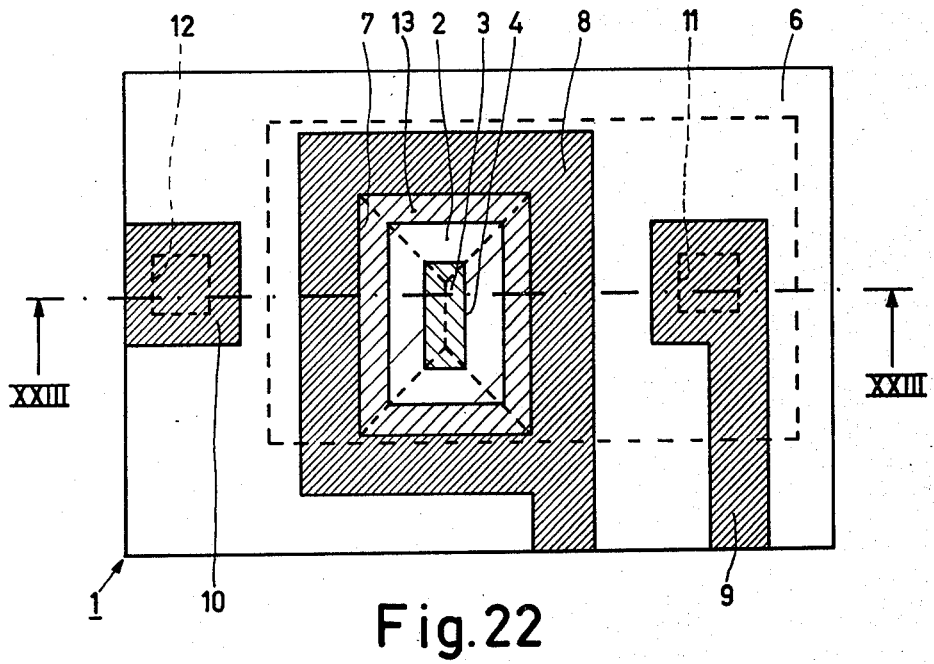
Figure 23:
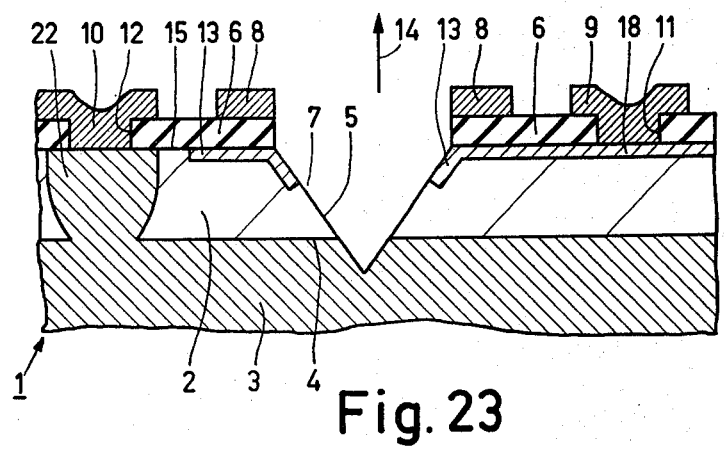
Figure 24:
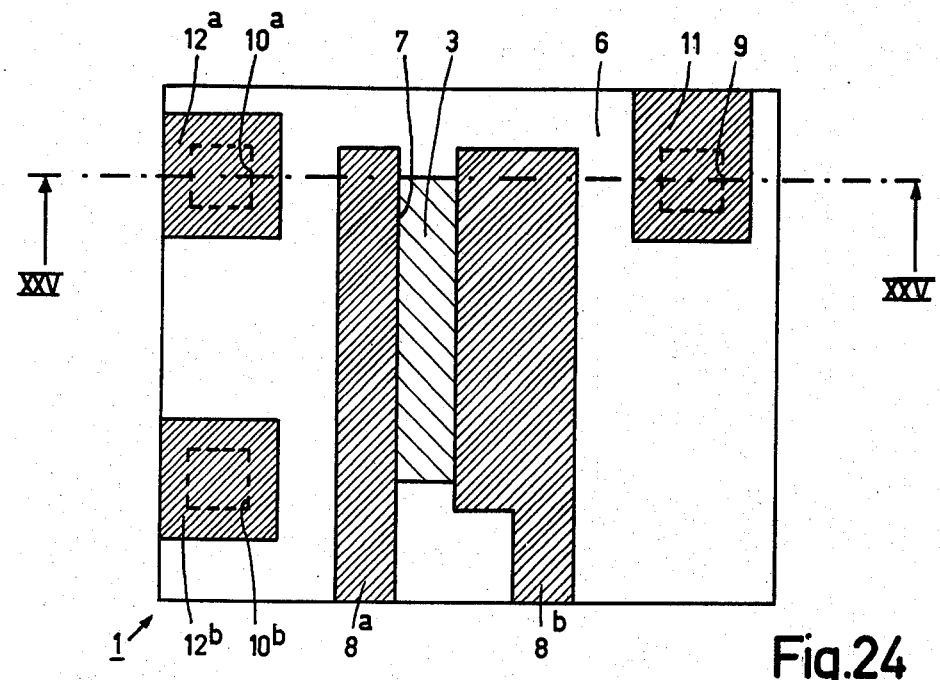
Figure 25:
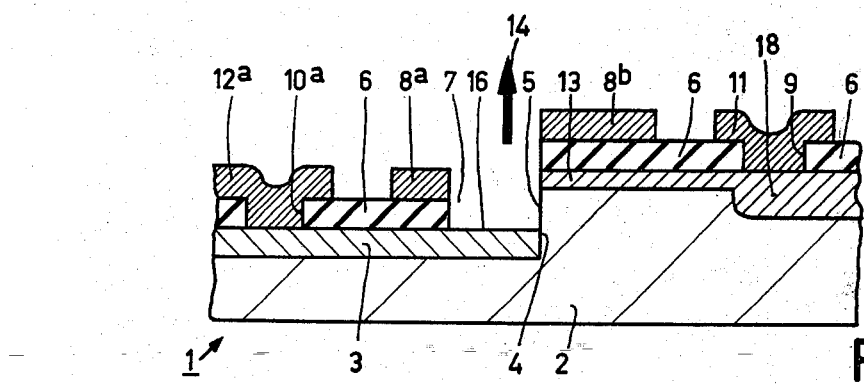
Figure 28:
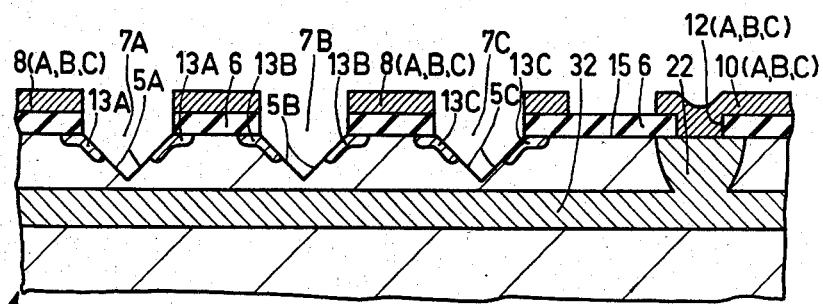
Figure 29:
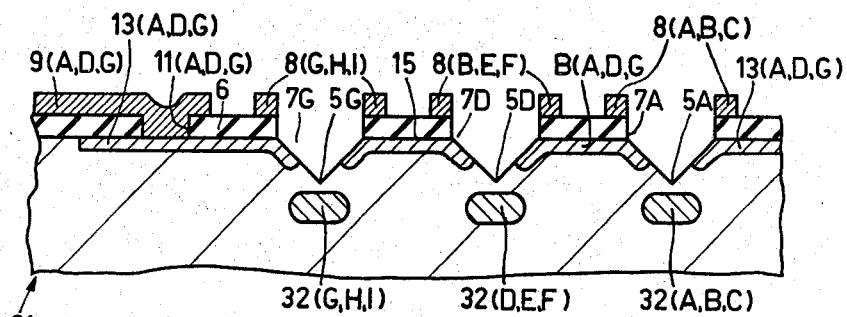
Figure 30:
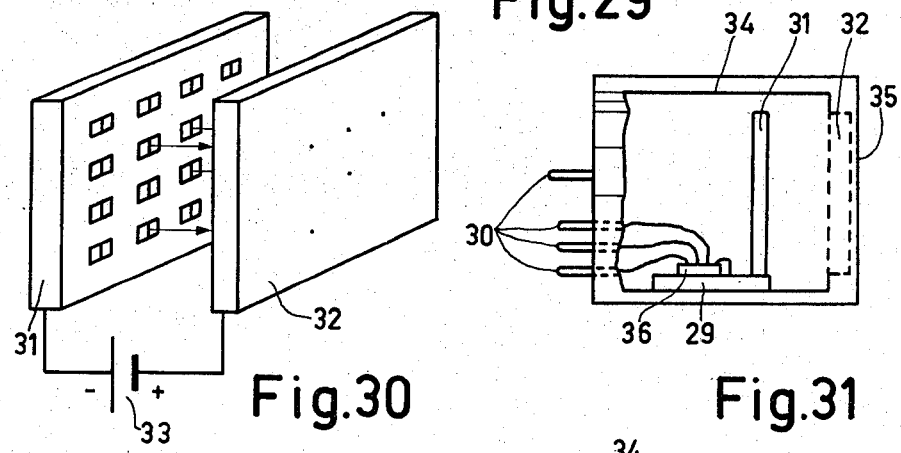
Figure 31:
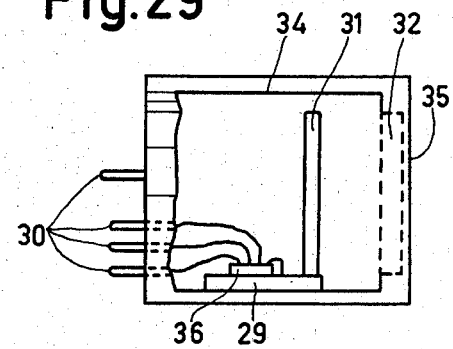
Figure 32:
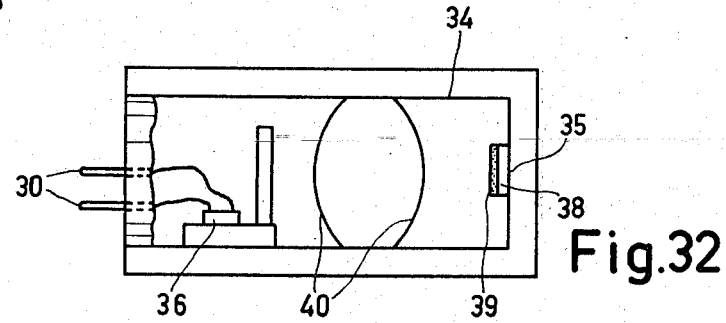

The present invention will now be described in greater detail, by way of example, with reference to a few embodiments and the drawing, in which FIG. 1 is a diagrammatic plan view of a semiconductor device according to the invention, FIG. 2 is a diagrammatic cross-sectional view of the semiconductor device taken on the line II—II in FIG. 1, FIG. 3 is a diagrammatic cross-sectional view of the semiconductor device taken on the line III—III in FIG. 1, FIG. 4 is a diagrammatic cross-sectional view of the semiconductor device taken on the line IV—IV in FIG. 1, FIGS. 5 to 8 are diagrammatic cross-sectional views of the semiconductor device shown in FIG. 2 in successive stages of a method according to the invention, FIG. 9 is a diagrammatic plan view of another embodiment of a semiconductor device in accordance with the invention, FIG. 10 is a diagrammatic cross-sectional view of the semiconductor device taken on the line X—X in FIG. 9, FIG. 11 is a diagrammatic cross-sectional view of the semiconductor device taken on the line XI—XI in FIG. 9, FIGS. 12 to 15 are diagrammatic cross-sectional views of the semiconductor device shown in FIG. 10 in successive stages of a method according to the invention, FIG. 16 is a diagrammatic cross-sectional view of again another semiconductor device according to the invention, FIG. 17 is a diagrammatic plan view of another embodiment of a semiconductor device in accordance with the invention, FIG. 18 is a diagrammatic cross-sectional view of the semiconductor device taken on the line XVIII—XVIII in FIG. 17, FIG. 19 is a diagrammatic plan view of still another semiconductor device in accordance with the invention, FIG. 20 is a diagrammatic cross-sectional view of the semiconductor device taken on the line XX—XX in FIG. 19, FIG. 21 is a diagrammatic cross-sectional view of the semiconductor device taken on the line XXI—XXI in FIG. 19, FIG. 22 is a diagrammatic plan view of again another embodiment of a semiconductor device in accordance with the invention, FIG. 23 is a diagrammatic cross-sectional view of the semiconductor device taken on the line XXIII—XXIII in FIG. 22, FIG. 24 is a diagrammatic plan view of still another embodiment of a semiconductor device in accordance with the invention, FIG. 25 is a diagrammatic cross-sectional view of the semiconductor device taken on the line XXV—XXV in FIG. 24, FIG. 26 shows diagrammatically a cathode-ray tube in which a semiconductor device according to the invention is used, FIG. 27 is a diagrammatic plan view of a semiconductor device in accordance with the invention for use in a display device, FIG. 28 is a diagrammatic cross-sectional view of a semiconductor device taken on the line XXVIII—XXVIII in FIG. 27, FIG. 29 is a diagrammatic cross-sectional view of a semiconductor device taken on the line XXIX—XXIX in FIG. 27, FIG. 30 is a diagrammatic perspective view of a part of such a display device, while FIG. 31 shows diagrammatically such a display device for display applications, and FIG. 32 shows diagrammatically such a display device for use in electron lithography.

The Figures are diagrammatic and not drawn to scale in which for clarity particularly the dimension in the thickness direction are strongly exaggerated in the cross-sectional views. Semiconductor zones of the same conductivity type are generally shaded in the same direction. Corresponding parts are generally referred to by the same reference numerals in the Figures.

The semiconductor device shown in FIG. 1, of which diagrammatic cross-sectional views taken on the lines II—II, III—III and IV—IV are shown in FIGS. 2, 3 and 4 respectively, is designed to generate electron flows, and for that purpose comprises a cathode having a semiconductor body 1, in this example of silicon. In this example the semiconductor body comprises an n-type substrate 2 in which a p-type region 3 is situated; and as a result of this the p-n junction 4 is formed which terminates at the surface 5 so that the depletion zone 17 associated with the p-n junction adjoins the surface 5. By applying a voltage in the reverse direction across the p-n junction, electrons are generated by avalanche multiplication and emanate from the semiconductor body.

In practice the efficiency of such a device, notably when silicon is used as a semiconductor material, is so low that a useful device is out of the question. This is mitigated by the use of silicon carbide, but this is disadvantageous technologically because the technology in manufacturing integrated circuits is not suitable in this case.

According to the present invention, the surface is provided with an electrically insulating layer 6, for example silicon oxide, in which at least one aperture 7 is provided. Within this aperture at least a part of the p-n junction is uncovered. Furthermore, an accelerating electrode 8, in this example of polycrystalline silicon, is provided on the insulating layer 6 on the edge of the aperture 7 in the immediate proximity of the p-n junction 4.

The semiconductor device furthermore comprises connection electrodes 9 and 10 which are connected, through the contact windows 11 and 12, to the n-type substrate 2 and the p-type region 3, respectively. Contacting with the n-type substrate is preferably carried out through a highly doped n-type contact 18.

When voltages are applied to the electrodes 9 and 10 so that electrode 10 is negative with respect to electrode 9, the p-n junction 4 is reversely biased.

As a result of this a depletion zone is formed on both sides of the p-n junction, that is to say a region in which substantially no mobile charge carriers are present. Outside the depletion zone conduction is readily possible so that substantially the entire applied voltage is across the depletion zone. The associated electric field can now become so high that avalanche multiplication occurs. Electrons will be released in the depletion zone and be accelerated by the field present in such manner that they form electron-hole pairs upon colliding with silicon atoms. The electrons formed as a result of this are in turn accelerated by the electric field and can again form electron-hole pairs. The energy of the electrons can be so high that the electrons have sufficient energy to emanate from the material. As a result of this electron flow is formed which is shown diagrammatically in FIG. 2 by the arrow 14. In the device according to the invention, released electrons are accelerated in a direction approximately perpendicular to the surface 5 by giving the accelerating electrode 8 which is situated on the insulating layer 6 at the edge of the aperture 7, a positive potential with respect to the semiconductor body 1. In this case it is usually an extra acceleration in this direction because such a semiconductor structure (cathode) forms in practice part of a device in which a positive anode or another electrode, for example a control grid, is already present, whether or not at some distance. An extra advantage of this invention is that the electron flow can be modulated by varying the voltage at the accelerating electrode. Independently of this, of course the possibility exists of modulating current through the p-n junction.

In the present example the semiconductor body is formed by a silicon substrate. An advantage of the use of silicon is that the device can be manufactured by means of technologies known for the manufacture of integrated circuits in silicon. By providing the accelerating electrode 8 a practically useful efficiency of a semiconductor cathode, as described above, can also be obtained while using silicon.

In this example the electrically insulating layer 6 consists of silicon oxide, while the accelerating electrode 8, as well as the connection electrodes 9 and 10, consist of doped polycrystalline silicon. However, any other suitable material may be chosen for the insulating layer, for example, a silicon nitride-silicon oxide double layer, while for the electrodes any other material conventionally used in semiconductor technology for metallisation purposes, for example aluminum, may be used.

In this example, the acceptor concentration in the p-type region 3 is, for example, $10^{19}$ atoms/cm$^3$ while the donor concentration in the n-type region 2 is much lower, for example $10^{15}$ atoms/cm$^3$. In the low-doped region, being in this example the n-type region, a surface region 13 is present at the area of the p-n junction in the aperture having an increased doping of impurities causing n-conductivity type. As a result of the higher doping, the depletion layer in the surface region 13 at the area of the p-n junction 4 is narrower than in remaining parts of the n-type region 2. The result of this is that here the field strength at a given voltage in the reverse direction across the p-n junction is larger than in other places along the p-n junction, and hence avalanche multiplication will occur easiest in this place. Moreover, as a result of a voltage at the accelerating electrode, a further narrowing of the depletion zone along the surface occurs in addition to the decrease of the emanating potential (Schottky effect). The avalanche multiplication remains mainly restricted herewith to those parts of the p-n junction which are present in the aperture 7.

In this example the accelerating electrode 8 has a conductive layer which is provided on the insulating layer and has a window at the area of the aperture in the insulating layer. Such a construction presents advantages from a point of view of manufacture and design.

In this example the aperture 7 is in the form of a narrow gap having a width which is of the same order of magnitude as the thickness of the insulating layer. For example, the width of the gap is 2 μm, the thickness of the oxide layer is 1 μm. By choosing these dimensions in this manner and providing the accelerating electrode in the immediate proximity on the edge of the aperture, and preferably around the aperture, an equipotential plane is obtained above the gap, which allows the above-mentioned acceleration perpendicular to the surface 5. In order to prevent aligning problems with these small dimensions during manufacture, the p-n junction in this example is provided perpendicularly to the gap.

The emission of electrons may in addition be increased by covering the semiconductor surface 5 at the area of the p-n junction 4 with a material reducing the work function, such as a material containing barium or cesium.

The device shown in FIG. 1 may be manufactured as follows (see FIGS. 5 to 8).

The starting material is a semiconductor body of one conductivity type, for example, an n-type silicon substrate 2, whose resistivity in this example is approximately 0.001 ohm.cm and on which an epitaxial layer having a resistivity of approximately 6 ohm.cm and a thickness of approximately 10 μm is grown. The overall thickness of the semiconductor body is now approximately 250 μm. It will be obvious that several devices can be present on one slice which are manufactured simultaneously. The surface 5 is provided in known manner with a masking layer 19, such as silicon oxide formed by thermal growth (see FIG. 5).

A window 20 is formed photolithographically in the masking layer 19 for a subsequent doping step. As a result of this doping a region 3 of the second conductivity type, or in this example the p-type, is provided in the semiconductor body 2, so that a p-n junction 4 terminates at the surface 5. The p-type region 3 is provided in known manner by means of diffusion or ion implantation. Diffusion takes place down to a depth of approximately 2 μm. If the p-type region 3 is realised by means of ion implantation, boron atoms for example are fired into the silicon with an energy of 30 keV and a dose of $10^{14}$ atom/cm$^2$, after which out-diffusion occurs down to a depth of 2 μm. The oxide serves as a mask. After this treatment the device shown in FIG. 6 has been obtained. An n-contact zone 18, see FIG. 11, is formed in a similar manner prior to or after the p-doping.

According to the present invention, after removing the masking layer 19 the surface 5 is provided with an insulating layer 6, for example, by thermal growth of silicon oxide or by deposition from the vapor phase. After providing this layer with contact windows 11 and 12 at the area of the contacts 9 and 10 to be formed afterwards, a conductive layer, for example a polycrystalline silicon layer 21 (see FIG. 7), is provided on the insulating layer 6.

At the area of the p-n junction 4, an aperture 7 is provided in both the polycrystalline layer 21, and in the insulating layer 6, for example, by first locally etching the polycrystalline silicon, such as by means of plasma etching, and then etching away the silicon oxide thus exposed, for example in a hydrofluoric acid-containing etchant or by means of plasma etching.

The doping concentration at the area of the aperture 7 in the surface region 13 is increased by means of ion implantation with the polycrystalline silicon layer 21 in this example serving as a mask and also being doped.

This implantation takes place, for example, with arsenic ions having an energy of 25 keV and a dose of $2.10^{13}$ atoms/cm$^2$, after which an annealing treatment is carried out. The configuration shown in FIG. 8 is then obtained.

The device shown in FIG. 2 is finally completed by photolithographically bringing the polycrystalline silicon into the desired pattern.

The device is then cleaned in the usual manner and contacted and finally assembled whether or not after metallisation of the polycrystalline silicon.

According to the invention it is sufficient for the depletion zone associated with the p-n junction to be exposed at the surface 5. A semiconductor device according to the invention in which this has been realised is shown in the plan view of FIG. 9, while FIGS. 10 and 11 are cross-sectional views of the device taken on the lines X—X and XI—XI of FIG. 9.

In this example the device consists of a semiconductor body 1 having a p-type substrate 3 on which an n-type epitaxial layer 2 is present. Since the p-type region is doped much more heavily (for example $10^{19}$ atoms/cm$^3$) than the n-type region (approximately $10^{14}$ atoms/cm$^3$), the depletion layer 17 will extend mainly in said n-type region. A recess has been provided in the major surface 15 with such a depth that the bottom 16 of the recess lies within the region where the depletion layer 17 is present in the n-type region 2. The semiconductor surface 15 also includes an electrically insulating layer 6, while an accelerating electrode 8 is provided on the electrically insulating layer around the aperture 7. A connection electrode 9 is connected by the contact window 11 and the conact zone 18 to the n-type region 2. In this example the p-type region 3 is contacted by a contact 10 on the lower side but, if desired, it may alternatively be contacted by means of a deep contact zone on the upper side.

Figure 12:
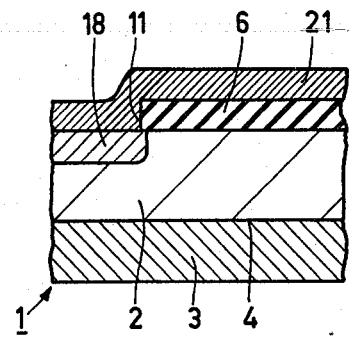
Figure 13:
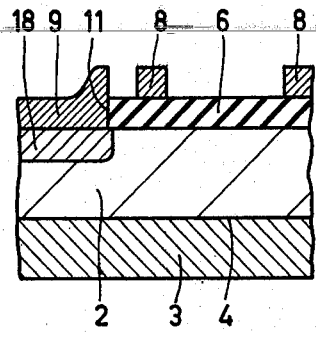
Figure 14:
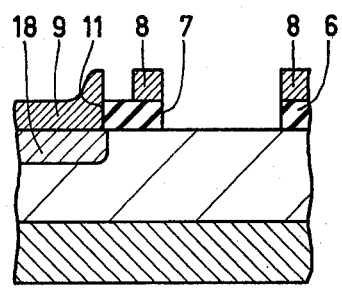

The manufacture of a semiconductor device as shown in FIG. 10 takes place in approximately the same manner as that of the semiconductor device shown in FIG. 2 (see FIGS. 12 to 15). After defining contact windows in the insulating layer 6 in behalf of the contacts, which windows contact the n-contact zones 18 (and p-contact zones, if any), the assembly is covered with a conductive layer 21, for example, of aluminium (FIG. 12). A pattern of contact electrodes 9 and accelerating electrodes 8 is provided herein in known manner (FIG. 13). At the area of the aperture 7, the insulating layer 6 is etched using the accelerating electrode 8 as a mask (FIG. 14), after which the silicon is etched away down to the desired depth by means of either the same mask or, for example, if the accelerating electrode 8 does not fully surround the aperture 7 and hence an auxiliary mask is also necessary upon etching the insulating layer 6, using the insulating layer 6 as a mask (FIG. 15). Finally, by providing the contact layer 10, the configuration of FIG. 10 is obtained. If the starting surface is oriented along a (100) plane, etching may also be carried out anisotropically and in that case a recess is obtained which is oriented along crystal facets (FIG. 16).

Dependent on the application, the aperture 7 may have quite a different shape. FIG. 17, for example, is a plan view and FIG. 18 a cross-sectional view taken on the line XVIII—XVIII of FIG. 17 of a semiconductor device in which emission takes place according to a substantially square figure. The reference numerals have the same meanings as in FIGS. 1 to 4. Although due to the diagrammatic character of the drawing this is not very readily obvious, the interruption of one side in behalf of the connections will be very small as compared with the overall length of the side, so that this is no disadvantage for practical applications. In this case the accelerating electrode consists of two parts 8a and 8b which, if desired, may have different potentials so that the beam emanating from the square can be deformed within certain limits and/or deflected by control with the accelerating electrodes and, if desired, be caused to coincide in substantially one point. Of course, the emission pattern may alternatively be chosen to be circular or to have any other pattern.

FIG. 19 is a plan view and FIGS. 20 and 21 are cross-sectional views taken on the lines XX—XX and XXI—XXI of another cathode according to the invention, in which a recess is provided in the major surface 15 while the p-n junction terminates at the surface 5 which forms a wall of the recess. In this case the semiconductor device 1 comprises a p-type substrate 3 on which an n-type layer 2 is provided, for example, by epitaxial growth. A recess is provided herein by etching, the bottom of such recess being situated in the p-substrate 3 or below the p-n junction 4. An electrically insulating layer 6, for example of silicon oxide, on which the accelerating electrode 8 is provided, is situated on the n-type layer 2. For applying a voltage in the reverse direction across the p-n junction, a connection electrode 9 is present in the device and adjoins the n-type layer 2 by a contact window 11 and an n-type contact zone 18. The connection electrode 10 for the p-type region is formed in this example by a conductive plate on the lower side of the semiconductor body, but, if desired, it may be provided on the upper side in the same manner as the connection electrode 9, namely where p-type contact diffusions are provided through the n-type region 2. As a result of the electric field which is generated by means of a potential at the accelerating electrode 8, a narrowing of the depletion zone occurs and in this case also at the surface 5 so that the avalanche multiplication is restricted to the part of the p-n junction 4 near the surface 5.

As already noted, the recess may alternatively be provided by an anisotropic etching treatment; an example hereof is shown in FIG. 22 which is a plan view of a semiconductor device thus manufactured, while FIG. 23 is a sectional view taken on the line XXIII—XXIII of FIG. 22. The device shown comprises a semiconductor body 1 having a p-type substrate 3 on which an n-type layer 2 is provided by epitaxial growth which layer in turn is covered by an electrically insulating layer 6. The electrically insulating layer 6 includes an aperture 7 in which a V-shaped recess is provided by an anisotropic etching treatment and penetrates into the p-type substrate 3. The walls of the recess in this example form the surface 5 at which the p-n junction terminates. Around the aperture 7 an accelerating electrode 8 is provided on the electrically insulating layer 6. Furthermore, contact windows 11 and 12 are provided in the electrically insulating layer 6 through which the connection electrodes 9 and 10 are connected to the contact zone 18 which in this example coincides with the surface zone 13 of increased concentration and the deep contact zone 22 which contacts the p-type substrate, respectively.

As already explained above, it is not necessary for the V-shaped recess to extend into the p-type substrate, but it is sufficient when the depletion layer associated with the p-n junction adjoins the surface. In the present case such dopings of the substrate and the epitaxial layer may be chosen such that the depletion layer extends up to the surface region 13.

Another example of a cathode according to the invention is the semiconductor device which is shown as a diagrammatic plan view in FIG. 24 and as a diagrammatic cross-sectional view in FIG. 25 taken on the line XXV—XXV of FIG. 24. This semiconductor device 1 comprises an n-type substrate 2. The substrate comprises a recess having a bottom 16. At the area of the recess the substrate has a p-type region 3. The dopings of the substrate 2 and the region 3 may again be chosen to be so that the depletion zone associated with the p-n junction 4 formed by the region extends up to the more highly doped n-type surface region 13. Therewith the depletion layer adjoins the surface 5 which in this case forms the wall of the recess so that, when the p-n junction is reversely biased, avalanche multiplication can occur and consequently an electron flow which is shown diagrammatically by the arrow 14 can be generated. For the reverse connection, the device comprises contact windows 11 and 12a in the electrically insulating layer 6, through which windows the connection electrodes 9 and 10a are connected respectively to the n-contact region 18 and the p-type region 3. The accelerating electrode is constructed in this example as two different electrodes 8a and 8b which, if necessary, may have different potentials so that the emanating electron beam can be deflected, if desired. In addition, the p-region has two connection electrodes 10a and 10b which are situated at some distance, through the associated contact zones 12a and 12b. Herewith the possibility is created to pass a current through the device, temporarily or not temporarily with the p-n junction being slightly heated thermally so as to evaporate away (alien) absorbed molecules and atoms from the surface 5 without exposing the p-n junction of the high field strengths which cause avalanche multiplication.

FIG. 26 shows diagrammatically a cathode ray tube including a hermetically sealed vacuum tube 23 which is flared with the end wall being coated with a fluorescent screen 24 on its inside. The tube further comprises focusing electrodes 25, 26 and deflection electrodes 27, 28. The electron beam 14 is generated in one or more cathodes, as described above, which are situated in semiconductor body 1 mounted on a holder 29. Electric connections of the semiconductor device are passed through leadthroughs 30. In a similar manner a cathode according to the invention can be assembled, for example, in pick-up devices of the vidicon type. Alternatively, the device may take the form, for example, of a memory tube in which an information-carrying charge pattern is recorded on a target by means of a variable electron flow generated by the cold cathode, after which the charge pattern is read by a constant electron beam generated preferably by the same cold cathode.

Since the cathodes can now be manufactured by means of the technology conventionally used for manufacturing integrated circuits in silicon, it is possible to realise several cathodes on one slice of silicon. An example of such a semiconductor device is shown diagrammatically in FIGS. 27, 28 and 29, where FIG. 27 is a plan view of a part of the device and FIGS. 28 and 29 are cross-sectional views taken on the lines XXVIII—XXVIII and XXIX—XXIX, respectively, of FIG. 27.

FIG. 27 is a diagrammatic plan view of a silicon slice 31 in which a matrix of cathodes is realised; and the cathodes shown in FIG. 27 are referenced A to I. For clarity FIG. 27 shows reference numerals only for the cathodes A, B, C which are also shown in FIG. 28.

The device comprises a system of cross-bars in which the X lines are formed by low-ohmic p-paths 32, while the highly doped surface regions 13 serve as Y lines. The silicon slice 31 is high-ohmic and may be either of the p-type or the n-type. A condition is that the slice and the n-type regions and the p-paths, respectively, have such a doping that the depletion zone extends up to the major surface 15. This ensures a good insulation of the n-type regions 13.

In this example the silicon slice 31 is of the n-type. The actual p-n junction 4 thus does not adjoin the surface 5; the associated depletion zone, however, extends up to the major surface 15 and does adjoin the surface 5. The location of the highly doped p-paths is shown in broken lines in FIG. 27, while the location of the highly doped n-type regions is denoted by dot-and-dash lines.

In the apertures 7 (7A, 7B, 7C . . . ) viewed in a plan view (FIG. 27) the highly doped regions 13 and the semiconductor body 31 are visible along the surfaces 5 (5A, 5B, 5C, . . . ) (see FIGS. 28, 29) of the V-shaped recesses.

The low-ohmic p-paths 32 are contacted through contact zones 22 which are connected to connection electrodes 12 through contact windows 10. The highly doped n-type regions 13 are connected to connection electrodes 11 through contact windows 9. Finally accelerating electrodes 8 are provided on the insulating layers and fully surround the aperture 7 in this example.

Now any cathode (A, B, C, . . . ) may be driven and be caused to emit by giving the associated connection electrodes 9 and 11 such a potential that avalanche multiplication occurs in the associated p-n junction and simultaneously giving the associated accelerating electrode a certain potential. In the embodiment described the potential need not be the same for all cathodes so that the emanating beams can be given different intensities. The accelerating electrodes 8 (A, B, C), 8 (D, E, F) and 8 (G, H, I) may be combined to form one assembly, if desired, as well as the p-paths 32; however, this reduces the flexibility of the circuit. By means of control electronics, for example, (shift) registers the contents of which determine which of the X lines and the Y lines, respectively, will be driven, a certain pattern of cathodes may be caused to emit, whereas, for example, by other registers, in combination with digital-to-analog converters, the potential of the accelerating electrodes can be adjusted. This makes such a device particularly suitable for flat display devices.

FIG. 30 is a diagrammatic elevation of such a flat display device, which comprises in addition to the semiconductor device 31, a fluorescent screen 32 which is activated by the electron flow originating from the semiconductor device. The distance between the semiconductor device and the fluorescent screen is, for example, 5 mm, while the space in which they are situated is evacuated. A voltage in the order of 5 to 10 kV is applied between the semiconductor device 31 and the screen 32 by the voltage source 33, which produces such a high field strength between the screen and the device that the image of a cathode is of the same order of magnitude as the cathode.

FIG. 31 shows diagrammatically such a display device in which the semiconductor device 31 is present in an evacuated space 34 at approximately 5 mm from the fluorescent screen 32 which forms part of the end wall 35 of the space. The device 31 is mounted on a holder 29 on which, if desired, other integrated circuits 36 are provided in behalf of the control electronics; and the space 34 has lead-throughs 30 for external connections.

FIG. 32 shows diagrammatically a similar vacuum space 34. It comprises a system 40 of electron lenses shown diagrammatically. In the end wall 35 is provided, for example, a silicon slice 38 covered with a photoresist layer 39. The pattern generated in the device 31, reduced, if necessary, by the system of lenses 40, is displayed on the photoresist layer 39.

Accordingly such a device permits displaying patterns on a photoresist layer. This presents great advantages because as a result of this the usual photomasks may be omitted and the desired patterns can be generated and corrected, if necessary, by control electronics in a simple manner.

It will be obvious that the invention is not restricted to the above-described examples. For example, the n-type region 2 in FIGS. 17 and 18 may alternatively be contacted on the lower side, notably if the device comprises only one cathode. The same applies to the device shown in FIGS. 27 to 29 when the body 31 consists of p-type material; in this case the accelerating electrodes 8 also serve as Y lines. When such a device is applied in the display device described, the auxiliary electronics need not necessarily be provided on an extra integrated circuit but may advantageously be realised alternatively in the body 31. It will be obvious that, in particular in the case of more extensive devices, multilayer wiring may be used.

Alternatively, in the device shown in FIG. 22, the accelerating electrode 8 may not be realised as one assembly but may be two parts which can be controlled individually so that the emanating electron beams can be deflected, if desired.

In the device shown in FIG. 25, the surface and the edges of the recess defined thereby need not necessarily coincide with the p-type layer underlying the recess but the recess, viewed as a plan view, may fall within the p-region so that p-n junction 4 is exposed at the surface 5.

In the methods various variations are also possible as well as in the realisations of the display device or pick-up device.

What is claimed is:

1. A method of manufacturing a semiconductor device comprising the steps of forming a semiconductor body having a p-n junction with a depletion zone at least locally adjoining a surface of said semiconductor body, providing an electrically insulating layer on said surface, providing an electrically conductive layer on said insulating layer, and forming an aperture through both said conductive layer and said insulating layer to at least a portion of said depletion zone at said surface exposed through said aperture.

2. A method according to claim 1, wherein ion implantation is carried out through said aperture to increase doping concentration of at least a portion of said surface.

3. A method according to claim 1, wherein said p-n junction terminates at said surface in said aperture.

4. A method according to claim 1, wherein a recess is formed by etching said surface through said aperture to a predetermined depth, said p-n junction extending at least partially parallel to a recess surface, and wherein said depletion zone adjoins said recess surface.

5. A method according to claim 4, wherein said etching is carried out by anisotropic etching.

6. A method according to claim 1, wherein a recess is formed by etching said surface through said aperture to a predetermined depth, said p-n junction terminating at a wall of a recess surface.

7. A method according to claim 6, wherein said etching is carried out by anisotropic etching.

8. A pick-up device comprising means for generating an electron beam including at least one semiconductor body having a p-n junction, a depletion zone of said p-n junction adjoining at least a surface of said semiconductor body, means for applying a reverse voltage across said p-n junction to generate avalanche multiplication of electrons from said semiconductor body, an electrically insulating layer provided on said surface of said semiconductor body, at least one aperture provided in said insulating layer for exposing at least part of said depletion zone, and electrode means formed on said insulating layer at an edge of said aperture for accelerating electrons through said aperture; means for controlling said electron beam; and means for scanning a charge image with said electron beam.

9. A display device comprising means for generating an electron beam including at least one semiconductor body having a p-n junction, a depletion zone of said p-n junction adjoining at least a surface of said semiconductor body, means for applying a reverse voltage across said p-n junction to generate avalanche multiplication of electrons from said semiconductor body, an electrically insulating layer provided on said surface of said semiconductor body, at least one aperture provided in said insulating layer for exposing at least part of said depletion zone, and electrode means formed on said insulating layer at an edge of said aperture for accelerating electrons through said aperture; means for controlling said electron beam; and means for producing an image by said electron beam.

10. A display device according to claim 9, wherein a fluorescent screen is situated in a vacuum closely adjacent to said semiconductor body, said fluorescent screen being activated by electrons originating at said semiconductor body.

* * * * *